United States Patent [19]

Chayka

[11] Patent Number: 5,952,046

[45] Date of Patent: Sep. 14, 1999

[54] METHOD FOR LIQUID DELIVERY CHEMICAL VAPOR DEPOSITION OF CARBIDE FILMS ON SUBSTRATES

[75] Inventor: Paul V. Chayka, New Milford, Conn.

[73] Assignee: Advanced Technology Materials, Inc., Danbury, Conn.

[21] Appl. No.: 09/010,002

[22] Filed: Jan. 21, 1998

[51] Int. Cl.⁶ ................................................ C23C 16/32
[52] U.S. Cl. ................................. 427/249.1; 427/249.2; 427/249.15; 427/249.17
[58] Field of Search ........................... 427/249, 248.1, 427/249.1, 249.2, 249.15, 249.17

[56] References Cited

U.S. PATENT DOCUMENTS

| | | | |
|---|---|---|---|
| 4,696,834 | 9/1987 | Varaprath | 437/223 |
| 5,153,295 | 10/1992 | Whitmarsh et al. | |
| 5,698,261 | 12/1997 | Ivanov et al. | 427/249 |

OTHER PUBLICATIONS

Golecki, Ilan et al., "Recent Advances in Rapid Vapor–Phase Densification of High–Temperature Fiber–Matrix Composites," Proceedings of the Annual Conference on Composites and Advances Ceramics, Sponsored by the ACERS, Cocoa Beach, Jan. 1997 No Page Data!.

Interrante, L. V. et al., "Hydridopolycarbosilane Precursors to Silicon Carbide, Synthesis, Pyrolysis and Application as a SiC Matrix Source," NATO ASI Series Volume, Application of Organometallic Chemistry in the Preparation and Processing of Advances Materials, J.F. Harrod and R. Laubem eds, Kluwer Academic Publishers, (1995), pp. 173–183 No Month Data!.

Interrante, L.V., et al., Fabrication of SiC Matrix Composites Using a Liquid Polycarbosilane Matrix Composites II, Ceramic Trans., vol. 58 (1995), pp. 111–118 No Month Data!.

Stinton, David P. et al., "Advance Ceramics by Chemical Vapor Deposition Techniques," Bull. Acers, 67(2), (1988), pp. 350–355 No Month Data.

Bhatt, Ramakrishna T. et al., "Effects of Fiber Coatings on Tensile Properties of Hi–Nicalon SiC/RBSN Tow Composites," presented at the Annual Meeting of the American Ceramic Society, Cincinnati, OH, May 1997 No Page Data!.

*Primary Examiner*—Roy V. King
*Attorney, Agent, or Firm*—Steven J. Hultquist; Oliver A. M. Zitzmann

[57] ABSTRACT

A method of forming a carbide material on a substrate, comprising vaporizing a carbide source reagent to form a carbide source reagent vapor, and contacting the carbide source reagent vapor with the substrate to deposit the carbide material on the substrate, wherein the carbide source reagent comprises a compound of the formula:

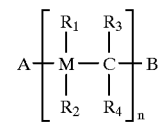

wherein:

$R_1$, $R_2$, $R_3$ and $R_4$ may each vary independently of the others and are selected from the group consisting of hydrogen and $C_1$–$C_8$ alkyl;

M is selected from the group consisting of Si, Nb, Ge, Sn, Pb, V, W, Cr, Mo, Ta, Ti, Zr, Hf, Mn, Pt, Pd, Ir, Rh and Ru;

A and B may vary independently of one another and are selected from the group consisting of $C_1$–$C_4$ alkyl; and n is at least 2.

The method of the invention may be used to form SiC or other carbide coatings on substrates to enhance tribological characteristics thereof, or to form thin film layers of SiC or other carbides for electronic device fabrication.

28 Claims, 2 Drawing Sheets

METHOD FOR LIQUID DELIVERY CHEMICAL VAPOR DEPOSITION OF CARBIDE FILMS ON SUBSTRATES

BACKGROUND OF THE INVENTION

1. Field Of The Invention

The present invention relates to a source reagent composition and method for liquid delivery chemical vapor deposition of carbide films on substrates, in a specific aspect, the invention relates to a silicon carbide source reagent composition and liquid delivery chemical vapor deposition method for depositing silicon carbide coatings on substrates such as surfaces, fibers, composite matrices and semiconductor device structures.

As used herein, the term "carbide" is intended to be broadly construed, to encompass carbides per se, as well as oxycarbides, within its scope.

2. Description of the Related Art

Carbides are commonly used in surface and interstitial coating applications where specific physical and/or electronic characteristics are desired. In physical applications, carbide coatings provide superior protection against heat, abrasion and corrosion. Additionally, carbide-based materials are coated on fiber matrices to form high-strength ceramic matrix composites. Under appropriate process conditions, various carbide materials can be made with desirable optical, electrical and semiconductive characteristics.

Fiber interface coatings can be applied to surfaces by using chemical vapor deposition (CVD) to achieve coatings on fibers or coatings over structures, or chemical vapor deposition in an infiltrative mode, viz., chemical vapor infiltration (CVI), to achieve matrices and fiber coatings within open structures. CVD is an attractive method for forming thin film coatings of various types, because CVD is readily scaled up to production runs, and the electronic and semiconductor industry has experience and an established equipment base in the use of CVD technology that can be applied to new CVD processes.

Whether forming carbide coatings on structures, fibers or matrices, or forming thin films for semiconductor or optical applications, a wide variety of source materials may be employed for CVD/CVI processes. These source materials include reagents and precursor materials of varying types, and in various physical states. To achieve highly uniform thickness layers of a conformal character on a semiconductor substrate, vapor phase deposition is used widely as a technique. Even in less controlled environments, for the coating of structures, fibers or matrices, CVD or CVI processes can be employed using varying reagents and precursor materials.

In vapor phase deposition, the source material may be of initially solid form which is sublimed or melted and vaporized to provide a desirable vapor phase source reagent. Alternatively, the reagent may be of normally liquid state, which is vaporized, or the reagent may be in the vapor phase in the first instance.

As used herein, the term "liquid delivery" when referred to chemical vapor deposition or other thin film or coating process refers to the fact that the precursor or source reagent composition for the material to be deposited on a substrate is vaporized from a liquid form to produce a corresponding precursor vapor which then is transported to the locus of deposition, to form the material film or coating on the substrate structure. The liquid phase which is vaporized to form the precursor vapor may comprise a liquid-phase source reagent per se, or the source reagent may be dissolved in or mixed with a liquid to facilitate such vaporization to place the source reagent in the vapor phase for the deposition operation.

CVD of carbide materials requires that the carbide source reagents, i.e., the precursor compositions for the carbide material to be deposited, be sufficiently volatile to permit gas phase transport into the chemical vapor deposition reactor. The carbide source reagent must decompose in the CVD reactor to deposit only the desired carbide material at the desired growth temperature(s). Premature gas phase reactions leading to particulate formation must not occur, nor should the source reagent decompose in the transport lines before reaching the reactor deposition chamber. These problems are important in CVD processes that use thermally unstable solid source precursors that display significant decomposition at conditions needed for sublimation. Such decomposition can occur in all reagent delivery systems that involve a vaporization step, not only in the vaporizer in a liquid delivery system but also in more conventional reagent delivery systems that include bubblers and heated vessels operated without carrier gas.

When carbide materials are desired to be deposited, obtaining optimal physical and/or chemical properties requires close control of stoichiometry which can be achieved if the reagent can be delivered into the reactor in a controllable fashion. In addition, the reagents must not be so chemically stable that they do not form the desired coating or film in the deposition chamber. In some cases, the source reagents are solids whose sublimation temperature may be very close to the decomposition temperature, in which case the reagent may begin to decompose in the lines before reaching the reactor, and it will be very difficult to control the stoichiometry of the deposited films.

CVD and CVI may also be used when it is desired to simply deposit a protective coating on a structural surface, fiber or throughout a porous material or structure. In this circumstance, close attention to stoichiometry and process control are not as important as is the case when the end product must have favorable physical and/or chemical, e.g., conductive, properties. An example of such application would be using CVD or CVI to form a carbide coating for its tribological or bulk strength characteristics. A specific example of such a coating is SiC as applied to ceramic matrix composites or used as a protective coatings on fibers and structures.

One method of delivering reagents or precursors into a CVD/CVI chamber is to directly inject the reagent liquid into the chamber where the reagent decomposes thereby depositing the desired compound on the object surface. When injecting the liquid reagent directly into the reaction chamber, the liquid would likely be sprayed in a mist form by a nebulizer or similar device to more evenly disperse the liquid reagent into the chamber environment. This technique is most appropriate when a protective coating is desired for structural or fiber applications and not for a more controlled, thin coating, as would be the case for a semiconductor material.

An alternative CVD process applicable to the semiconductor industry is liquid delivery, accomplished with the aid of a vaporization zone. In this zone the reagent liquid is flowed onto a flash vaporization matrix structure which is heated to a temperature sufficient to flash vaporize the reagent source liquid. A carrier gas may optionally be flowed by the flash vaporization matrix structure to form a carrier gas mixture containing the flash vaporized reagent source liquid. The use of a flash vaporization matrix structure allows for greater control and better formation of thin, uniform coatings or films as for example is desired in the semiconductor industry.

The means for flowing the precursor liquid onto the flash vaporization matrix or directly into the reaction chamber may comprise any suitable liquid pumping means, such as a positive displacement liquid pump or a liquid mass flow controller.

Within the family of carbides, silicon carbide (SiC) is perhaps the most popular fiber interface coating in oxide and non-oxide reinforced ceramic matrix composites. A common precursor presently used for the vapor deposition of SiC is methyltrichlorosilane (MTCS). The advantages of MTCS include its high volatility and reasonable Si yield, which makes it well suited to CVD/CVI processes. Table 1 shows the relevant physical and chemical properties of MTCS, and includes several which make it a useful precursor for SiC applications.

TABLE 1

Characteristics of Methyltrichlorosilane (MTCS)

| MTCS Formula: | $CH_3SiCl_3$ | Melt. Pt.: | −77.8° C. |
|---|---|---|---|
| Wt. % Si: | 19 | Boil. Pt.: | 31° C. |
| Molec. Wt.: | 149.50 | Vapor Pressure: | no data |
| Spec. Gravity: | 1.27 | Flash pt.: | 5° C. |
| Thermal Decomposition Products: | | HCl, CO, $SiO_2$ | |
| Reactivity with Water: | | Forms toxic, corrosive HCl fumes | |
| Hazard Classification: | | Flammable, Corrosive, Toxic | |

As a raw material for such applications, MTCS is also relatively inexpensive. There are, however, certain practical disadvantages to using MTCS as a SiC application precursor.

MTCS is highly moisture-sensitive, forming corrosive and toxic HCl fumes upon contact with moisture, a fact that significantly complicates storage, disposal, handling and pumping of such material. Generation of corrosive products in CVD and CVI processes also complicates effluent treatment, both technically and economically. Due to its corrosivity in pumping equipment, delivery of MTCS vapor to the CVD/CVI reactor is best done using bubbler methods. However, bubbler methods have led to poor control in delivery rate of the precursor vapor to the reactor to such extent that customized liquid delivery (pump) systems and/or alternative precursors are desired.

Additional problems associated with the use of MTCS as a SiC precursor include the need to use very large amounts of hydrogen to transport the MTCS vapor and provide the reducing atmosphere needed to form SiC. This high volume use of hydrogen poses both hazard risks and cost penalties.

A further disadvantage of using MTCS for deposition of SiC is that, under typical operating conditions, the required temperature range falls approximately between 1000–1400° C. Unfortunately, most available substrates for which SiC and other similar coatings are desired, have a temperature limit of between 800–1200° C. Lastly, MTCS can also yield detrimental oxygen incorporation in SiC coatings formed using such source reagent.

Accordingly, it is an object of the present invention to provide a composition and method for the formation of carbide materials on substrates.

It is another object of the invention to provide an improved process for CVD/CVI of silicon carbide.

It is a still further object of the present invention to provide a method for forming carbide coatings on fibers, surfaces and other substrates using the CVD process, that is safer than the CVD carbide coating forming processes of the prior art.

It is yet another object of the invention to provide a CVD process for forming carbides on a substrate, which is able to be carried out at lower temperatures than processes of the prior art for forming SiC coatings.

Other objects and advantages of the present invention will be more fully apparent from the ensuing disclosure and appended claims.

SUMMARY OF THE INVENTION

The present invention relates to a composition and method for forming a carbide material on a substrate.

The carbide source reagent composition of the invention comprises a carbide source reagent of the formula:

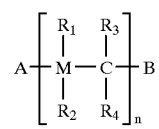

wherein:

$R_1$, $R_2$, $R_3$ and $R_4$ may each vary independently of the others and are selected from the group consisting of hydrogen and $C_1$–$C_8$ alkyl;

M is selected from the group consisting of Si, Nb, Ge, Sn, Pb, V, W, Cr, Mo, Ta, Ti, Zr, Hf, Mn, Pt, Pd, Ir, Rh and Ru, or alternatively M may be any other suitable tetravalent element which is compatible and stable in such formula at standard temperature (25° C.) and pressure (1 atmosphere) conditions;

A and B may vary independently of one another and are selected from the group consisting of $C_1$–$C_4$ alkyl, e.g., methyl or t-butyl; and n is at least 2.

The number n of repeating units

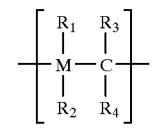

suitably is a number in the range of from 2 up to the number of repeating units at which the volatility of the source reagent becomes unsuitably low for liquid delivery and/or chemical vapor deposition. More preferably, the number n is a number in the range of from 2 to 12, and most preferably n is from 2 to 8.

Preferably, each of $R_1$, $R_2$, $R_3$ and $R_4$ is hydrogen, so that the carbide source reagent is of the formula:

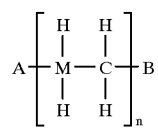

wherein A, B, M and n are as described above.

When the source reagent is employed to form SiC on a substrate, the carbide source reagent is suitably of the formula:

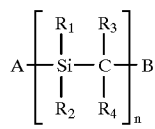

wherein A, B, n, and $R_1$, $R_2$, $R_3$ and $R_4$ are as previously described herein.

Preferably, the carbide source reagent in such application is

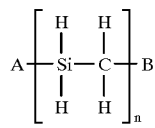

wherein A, B and n are as previously described herein.

In another aspect, the invention relates to a method of forming a coating of a carbide material on a substrate, comprising forming a vapor of a carbide source reagent and contacting the substrate with the vapor, wherein the carbide source reagent comprises a compound of the formula:

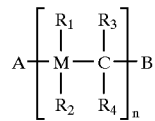

wherein:
$R_1$, $R_2$, $R_3$ and $R_4$ may each vary independently of the others and are selected from the group consisting of hydrogen and $C_1$–$C_8$ alkyl;

M is selected from the group consisting of Si, Nb, Ge, Sn, Pb, V, W, Cr, Mo, Ta, Ti, Zr, Hf, Mn, Pt, Pd, Ir, Rh and Ru, or alternatively M may be any other suitable tetravalent element which is compatible and stable in such formula at standard temperature (25° C.) and pressure (1 atmosphere) conditions;

A and B may vary independently of one another and are selected from the group consisting of $C_1$–$C_4$ alkyl; and n is at least 2.

In such method, each of $R_1$, $R_2$, $R_3$ and $R_4$ is preferably hydrogen and M is preferably Si, so that the carbide source reagent is of the formula:

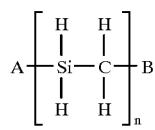

wherein A, B and n are as previously described herein.

In a particular embodiment of such method of forming a carbide material on a substrate, the method is carried out with liquid delivery chemical vapor deposition of the carbide source reagent. The source reagent may be employed for such purpose in a neat liquid form, or the source reagent may be dissolved or mixed into a solvent medium, such as a solvent composition of the type disclosed in U.S. Pat. No. 5,820,664 to Robin A. Gardiner, Peter S. Kirlin, Thomas H. Baum, Douglas Gordon, Timothy E. Glassman, Sofia Pombrik, and Brian A. Vaartstra, the disclosure of which is hereby incorporated herein by reference in its entirety.

Other aspects, features and embodiments of the invention will be more fully apparent from the ensuing disclosure and appended claims.

DETAILED DESCRIPTION OF THE INVENTION, AND PREFERRED EMBODIMENTS THEREOF

Figure 1:
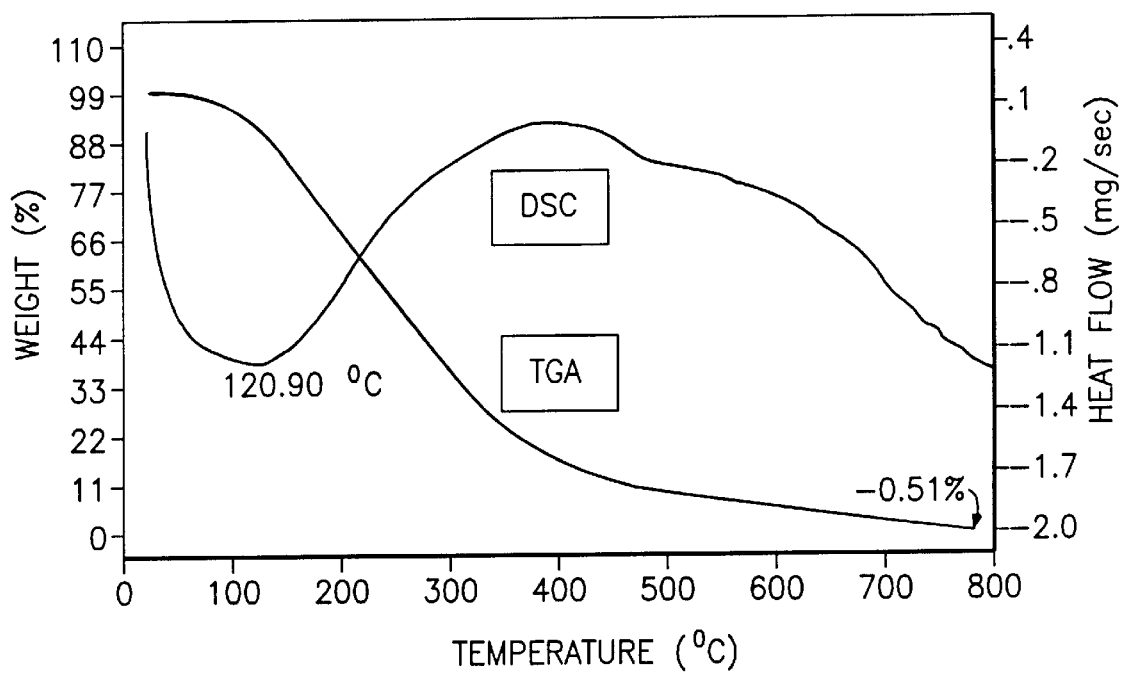
FIG. 1 is a plot of Thermal Gravimetric Analysis (TGA) and Differential Scanning Calorimetry (DSC) curves for an illustrative form of HPCS showing its advantageous characteristics for use as an MOCVD precursor.

The present invention is based on the discovery that films and coatings of SiC and other carbide materials may be usefully formed by chemical vapor deposition methods such as liquid delivery chemical vapor deposition, from carbide source precursors of the general formula:

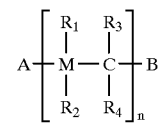

wherein:
$R_1$, $R_2$, $R_3$ and $R_4$ may each vary independently of the others and are selected from the group consisting of hydrogen and $C_1$–$C_8$ alkyl;

M is selected from the group consisting of Si, Nb, Ge, Sn, Pb, V, W, Cr, Mo, Ta, Ti, Zr, Hf, Mn, Pt, Pd, Ir, Rh and Ru, or alternatively M may be any other suitable tetravalent element which is compatible and stable in such formula at standard temperature (25° C.) and pressure (1 atmosphere) conditions;

A and B may vary independently of one another and are selected from the group consisting of $C_1$–$C_4$ alkyl; and n is at least 2.

When any of $R_1$, $R_2$, $R_3$ and $R_4$ in the source reagent of the above general formula is alkyl, such substituent preferably is $C_1$–$C_4$ alkyl, and more preferably is methyl.

Most preferably, however, each of $R_1$, $R_2$, $R_3$ and $R_4$ is hydrogen, so that the source reagent is of the formula:

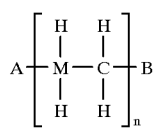

wherein A, B, M and n are as described above.

When the CVD method of the invention is carried out to form a SiC coating or film on a substrate, the carbide source reagent is suitably of the formula:

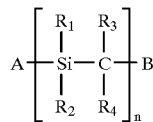

wherein A, B, n, and $R_1$, $R_2$, $R_3$ and $R_4$ are as previously described herein, and most preferably, the source reagent is of the formula:

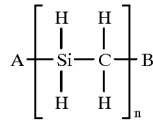

wherein A, B and n are as previously described herein.

The source reagent compositions of the invention are utilized in forming a coating or film of a carbide material on a substrate, by vaporizing the carbide source reagent and contacting the resulting vapor with the substrate under deposition conditions of temperature, pressure and concentration of the source reagent composition in the vapor phase. An appropriate flux of material is provided to form the desired layer of material on the substrate.

For liquid delivery CVD of the carbide film or coating on the substrate, the carbide source reagent may be provided as a liquid starting material which then is vaporized to form the precursor vapor for the chemical vapor deposition process.

The vaporization may be carried out by injection of the liquid in fine jet, mist or droplet form into a hot zone at an appropriate temperature for vaporization of the source reagent liquid. Such injection may be carried out with a nebulization or atomization apparatus of conventional character, producing a dispersion of finely divided liquid particles, e.g., sub-micron to millimeter diameter scale. The dispersed liquid particles may be directed at a substrate at a sufficiently high temperature to decompose the source reagent and produce a coating of the carbide product on the substrate.

Alternatively, the liquid may be dispensed from a suitable supply vessel of same, onto a heated element, such as a screen, grid or other porous or foraminous structure, which is heated to a sufficiently high temperature to cause the liquid to flash volatilize into the vapor phase, as for example in the manner described in U.S. Pat. No. 5,204,314 to Peter S. Kirlin, et al. and U.S. Pat. No. 5,711,816 to Peter S. Kirlin, et al., the disclosures of which hereby are incorporated herein by reference in their entirety.

Regardless of the manner of volatilization of the source reagent, the vapor thereof is flowed to contact the substrate on which the carbide material is to be deposited, at appropriate deposition conditions therefor, which may be readily determined within the skill of the art, by the expedient of varying the process conditions (temperature, pressure, flow rate, etc.) and assessing the character and suitability of the resulting deposited material.

As an alternative to the use of the source reagent in a neat liquid form, the source reagent may be dissolved or mixed into a compatible solvent medium which does not preclude the efficacy of the resulting composition for CVD usage. For example, the source reagent may be utilized in a solvent composition of the type disclosed in the aforementioned U.S. Pat. No. 5,820,664 to Robin A. Gardiner, et al. The resulting solution or suspension of the source reagent and solvent medium may then be injected, dispersed, flash vaporized, or otherwise volatilized in any suitable manner, as for example by the techniques described above in connection with the use of the neat liquid source reagent.

In the carbide source reagent composition of the invention:

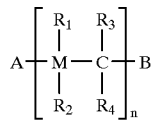

$R_1$, $R_2$, $R_3$ and $R_4$ may each vary independently of the others and are selected from the group consisting of hydrogen and $C_1$–$C_8$ alkyl;

M is selected from the group consisting of Si, Nb, Ge, Sn, Pb, V, W, Cr. Mo, Ta, Ti, Zr, Hf, Mn, Pt, Pd, Ir, Rh and Ru, or alternatively M may be any other suitable tetravalent element which is compatible and stable in such formula at standard temperature (25° C.) and pressure (1 atmosphere) conditions;

A and B may vary independently of one another and are selected from the group consisting of $C_1$–$C_4$ alkyl, e.g., methyl or t-butyl; and n is at least 2.

The number n of repeating units

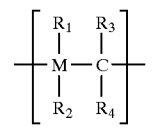

suitably is a number in the range of from 2 up to the number of repeating units at which the volatility of the source reagent becomes unsuitably low for liquid delivery and/or chemical vapor deposition. More preferably, the number n is a number in the range of from 2 to 12, and most preferably n is from 2 to 8.

The source reagent compositions of the invention may take any suitable structure within the above general formula. For example, the structure may be linear in character (i.e., straight-chain) or the structure may be cyclic. The structure wherein n is from 2 to 8 is most preferred. In general, as the number of repeat units n increases, the volatility of the source reagent declines, and it is generally not highly advantageous to utilize source reagent compositions in which n is greater than about 12. The source reagent composition may comprise a mixture of source reagent compounds of varying number of repeat units within the overall mixture, or the composition may be homogeneous in composition with respect to the number of repeat units n.

In such carbide source reagent, the substituents $R_1$, $R_2$, $R_3$, $R_4$ and M, and the end groups A and B are selected to yield a CVD product film carbide of the formula MC in which M is the desired carbide-forming elemental species. As mentioned, M may be Si, Nb, Ge, Sn, Pb, V, W, Cr, Mo, Ta, Ti, Zr, Hf, Mn, Pt, Pd, Ir, Rh or Ru, or alternatively M may be any other suitable tetravalent element which is compatible and stable in such formula at standard temperature (25° C.) and pressure (1 atmosphere) conditions, and useful in CVD utilization to form the desired carbide of species M.

Although $R_1$, $R_2$, $R_3$, and $R_4$ may be independently selected from hydrogen and $C_1$–$C_8$ alkyl, the specific substituents chosen must impart to the resulting source reagent compound appropriate volatilizability and vapor transport characteristics for the specific CVD application for which such source reagent compound is employed. The same considerations are applicable to the number n of repeating units of the source reagent composition, and the end groups A and B thereof. Appropriate choice can be made within the skill of the art by synthesizing derivatives of differing composition and assessment of the vaporization and CVD characteristics of such material and the character of the resulting films.

As an illustrative example of suitable carbide source reagents usefully employed in the broad practice of the present invention, SiC coatings may be formed in accordance with the method of the invention using hydridopolycarbosilane (HPCS),

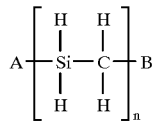

HPCS affords marked advantages over the prior art use of MTCS as a source reagent for the CVD formation of SiC films, coatings and infiltrations.

HPCS is a carbide source compound derived from polycarbosilane (PCS). HPCS is commercially available (e.g., from Starfire Systems, Inc., Watervliet, N.Y.) and is known in the art as a monomer polymerizable to yield allylhydridopolycarbosilane (AHPCS), but HPCS has not heretofore been contemplated by the art for use as a CVD source reagent. It has been found, however, that HPCS when used as a source reagent material for CVD unexpectedly yields high quality SiC, and is highly volatile with good vapor transport properties in such application. Various characteristics of HPCS are set out in Table 2 below.

TABLE 2

Characteristics of Hydridopolycarbosilane (HPCS)

| HPCS Gen. Formula:: | $SiH_2CH_2$ | Melt. Pt.: | −40° C. |
|---|---|---|---|
| Wt. % Si: | 60–65 | Boil. Pt.: | 90–150° C.(depends on M.W.) |
| Molec. Wt.: | 44 for basic formula | Vap. P: | <1mm Hg at 20° C. |
| Spec. Gravity: | 0.99 | Flash Pt.: | 25° C. for high viscosity HPCS, somewhat lower for lower viscosities |

Thermal Decomposition Products: $SiO_2$ fume, methylsilanes
Reactivity with Water: reacts slowly with no hazardous products
Hazard Classification: Flamm. Liq., no evidence of skin or nasal irritation As is apparent from the tabulated information of Table 2, there are numerous advantages to using HPCS over the prior art source reagent MTCS for applying SiC to a substrate, e.g., as a fiber coating, a matrix material for a structure composite, or a high temperature base material for semiconductor device fabrication thereon. Thermal analysis of the volatility and stability of HPCS reveals that such compound volatilizes almost completely in the vicinity of 240° C. at atmospheric pressure, with essentially no residue after heating to 800° C. HPCS can be produced with controllable molecular weight ranges and thus a selected favorable vapor pressure and viscosity.

As compared to MTCS, HPCS is relatively benign to handle as a chemical with regard to storage and transfer of such compound. Under CVD process conditions, HPCS exhibits superior environmental traits, because no corrosive components are generated in the resulting effluent stream. Unlike MTCS, HPCS yields very low oxygen and nitrogen in the SiC product. HPCS provides its own hydrogen supply, by virtue of its hydrogen substituents, and yields dense, amorphous SiC at temperatures as low as 550° C. Crystallization of the SiC in high temperature heat treatments subsequent to SiC film formation using HPCS as the source reagent also reveals the resulting crystallized SiC film to possess enhanced character as compared to SiC films derived from MTCS.

Similar processing and product film advantages are obtained with other carbide source compositions within the scope of the present invention.

The CVD carbide formation method of the present invention, in addition to utility for forming coatings or thin films of the carbide, may be employed for bulk formation of SiC or other carbide materials, as for example in fiber-reinforced composite applications, in which CVI is carried out to form the matrix phase material of the composite.

By way of specific illustration, ceramic whiskers or metal fibers may be provided in a mold or container or on a mandrel as a discontinuous phase (reinforcing material) for the composite, and such discontinuous phase mass may then be subjected to CVD to effect infiltration of the SiC or other carbide into the discontinuous phase, to fill the voids and interstitial spaces in the reinforcing material, and ultimately yield a composite material in which the carbide is the matrix material containing the reinforcement media.

Alternatively, the carbide material may be coated onto the reinforcing media as an interlayer before the continuous matrix material is infiltrated. For example, silicon carbide or other carbide material may be deposited on a discontinuous phase mesh of copper wire in a mat or other suitable form, to coat the fibers in the mat and provide an interlayer coating, and the resulting mass may thereafter be coated with a vitreous or glassy carbon material as the infiltrated, continuous phase matrix material for the composite.

Referring now to the drawings, FIG. 1 is a plot of Thermal Gravimetric Analysis (TGA) and Differential Scanning Calorimetry (DSC) curves for an illustrative form of HPCS showing its advantageous characteristics for use as an MOCVD precursor. The respective TGA and DSC curves for this sample of HPCS show that such source reagent volatilizes almost completely by about 240° C. at atmospheric pressure, and that almost no residue remains after heating of the source reagent to 800° C.

The utility of the invention was demonstrated by using HPCS for forming SiC coatings on mono and multifilament fibers of Nextel 610, by liquid delivery CVD. The resulting coating was uniform and dense, with thicknesses of from about 0.2 micron to about 2 microns.

Figure 2:
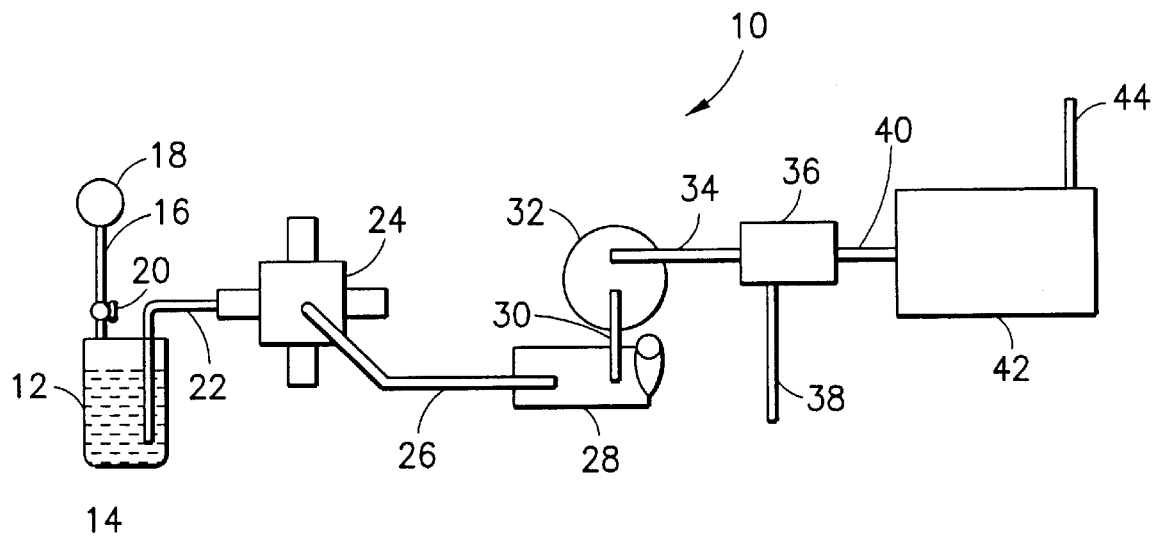
FIG. 2 is a schematic representation of an illustrative liquid reagent delivery and vaporization system for forming a carbide coating on a substrate in accordance with the present invention.

Referring now to FIG. 2, there is illustrated a schematic representation of a liquid reagent delivery and vaporization system for forming a carbide coating on a substrate in accordance with the present invention.

In the illustrated liquid reagent delivery and vaporization system, a carbide source reagent reservoir 12 contains liquid reagent 14, and is joined in flow communication with a source 18 of nitrogen or other inert gas by conduit 16 containing flow control valve 20 therein. Liquid reagent is motively withdrawn by means of the positive displacement pump 28 from the reservoir 12 in line 22 and flowed into the manifold 24. The manifold 24 may interconnect the reservoir with a multiplicity of liquid delivery and CVD systems of the type shown in FIG. 2, or alternatively the manifold may be coupled in flow communication with other similarly arranged reservoirs, for mixing of the carbide source reagent with other source reagents, adjuvants, etc.

The carbide source reagent then is flowed in line 26 to the positive displacement pump 28 and is discharged therefrom in line 30, and passes through the pulse damper 32 (to attenuate surges in the flow of the source reagent stream) to the vaporizer 36 via line 34. The vaporizer may also receive hydrogen or other carrier gas in line 38 from a suitable source of same (not shown). The vaporizer may be constructed and arranged in any suitable manner, to vaporize the liquid reagent and form reagent vapor, which may include the use of a heated vaporizer matrix (not shown) to better stabilize and control vapor formation.

The source reagent vapor, augmented with any hydrogen or carrier gas to form a reagent vapor stream, flows in line 40 to the chemical vapor deposition (CVD) chamber 42, in which deposit of the carbide material on a fiber, structure or substrate is carried out in a conventional CVD processing manner to form the desired carbide coating. Effluent gas is discharged from the CVD chamber in line 44 and may be passed to further processing or disposition.

Figure 3:
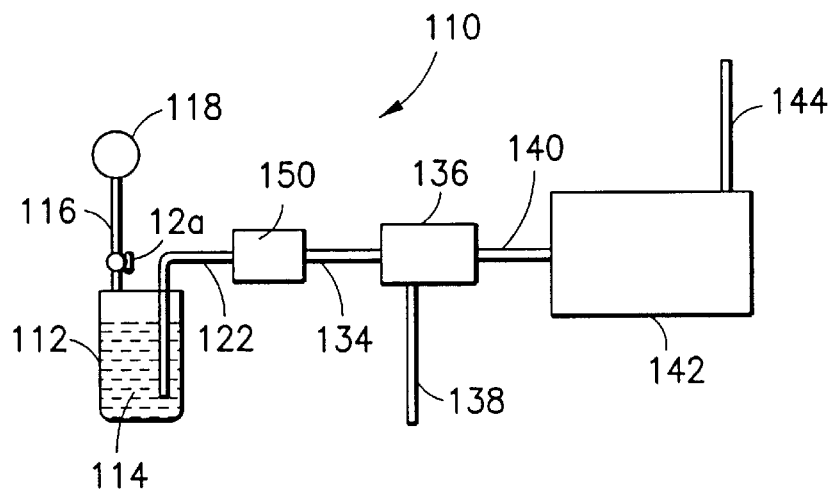
FIG. 3 is a schematic representation of a liquid reagent delivery and vaporization system incorporating a liquid mass controller, coupled to a chemical vapor deposition reactor, as another example of a liquid delivery CVD system usefully employed in the practice of the method of the present invention.

FIG. 3 is a schematic representation of a liquid reagent delivery and vaporization system incorporating a liquid mass controller, coupled to a chemical vapor deposition reactor, as another example of a liquid delivery CVD system that may be usefully employed in the broad practice of the present invention.

The FIG. 3 system utilizes a liquid reagent delivery and vaporization system 110 according to the present invention and employs a liquid mass flow controller coupled to the chemical vapor deposition reactor 142.

In the FIG. 3 system as illustrated, the corresponding elements of the process system are numbered correspondingly to the same elements in the FIG. 2 system, by addition of 100 to the reference numbers of the same or corresponding elements of the FIG. 2 system.

In place of the mixing manifold, positive displacement pump and pulse damper of the FIG. 2 system, the FIG. 3 arrangement utilizes a liquid mass flow controller 150 conducting liquid directly from the reagent reservoir 112 in lines 122 and 134 to the vaporizer 136. The pressurizing gas source in the FIG. 3 system, in contrast to the FIG. 2 system, is utilized to provide the motive force on the source reagent liquid, and thus may be constructed and arranged to impress a substantially higher pressure on the liquid than in the FIG. 2 system, where only a relatively low superatmospheric pressure is applied to the liquid, below that necessary to impel the liquid to flow through the flow circuit of the system. The liquid mass flow controller may be of any appropriate commercially available type, e.g., a Liqui-Flow™ liquid mass flow controller, commercially available from Porter Instrument Company, Inc.

The apparatus of FIG. 3 may be employed to variously handle neat liquids, solutions, and/or liquid reagent "cocktails," i.e., a solution which contains multiple solvents and solutes. Alternatively, the FIG. 3 system may be utilized to process a single carbide source reagent component, in neat or suspended/dissolved form in a suitable solvent medium, to form a corresponding carbide film on the substrate in the CVD reactor.

Although the preferred practice of the present invention involves the volatilization of the liquid-phase source reagent material in a vaporization zone followed by transport of the vapor to a chemical vapor deposition zone, an alternative CVD/CVI technique may be practiced in which the carbide source reagent is injected directly into the CVD reaction chamber itself.

The preferred method of introducing the liquid reagent into the chemical vapor deposition chamber depends on the nature of the volatility of the liquid reagent and the carbide coating desired in the final product.

If, for example, the product coating constitutes a protective coating to resist abrasion, heat and corrosive environments, the preferred CVD process may involve direct injection of the liquid carbide source reagent into the reaction chamber. Depending on the volatility of the carbide source reagent and the volume required, it may be desirable to nebulize the source reagent liquid prior to introducing the source reagent to the deposition chamber or it may be desirable to inject the source reagent directly into the chamber.

It will be apparent that the mode, means and manner of carrying out the CVD process of the invention may be widely varied in practice, as will be readily determinable within the skill of the art and without undue experimentation, by simple vaporization and deposition experiments, informed by physical property determinations such as those illustratively described in connection with FIG. 1 herein.

Thus, while the invention has been described herein with reference to specific embodiments and features, it will be appreciated the utility of the invention is not thus limited, and encompasses other variations, modifications, and alternative embodiments. Accordingly, the invention as hereafter claimed is intended to be broadly construed as comprehending all such alternative variations, modifications, and other embodiments, within its spirit and scope.

What is claimed is:

1. A method of forming a carbide material on a substrate, comprising vaporizing a carbide source reagent to form a carbide source reagent vapor, and contacting the carbide source reagent vapor with the substrate to deposit the carbide material on the substrate, wherein the carbide source reagent comprises a compound of the formula:

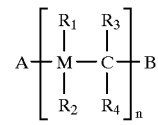

wherein:
R$_1$, R$_2$, R$_3$ and R$_4$ may each vary independently of the others and are selected from the group consisting of hydrogen and C$_1$–C$_8$ alkyl;
M is selected from the group consisting of Si, NB, Ge, Sn, PB, V, W, Cr, Mo, Ta, Ti, Zr, Hf, Mn, Pt, Pd, Ir, Rh and Ru;
A and B vary independently of one another and are selected from the group consisting of C$_1$–C$_4$ alkyl; and
n is at least 2.

2. A method according to claim 1, wherein each of R$_1$, R$_2$, R$_3$ and R$_4$ is independently selected from the group consisting of hydrogen and C$_1$–C$_4$ alkyl.

3. A method according to claim 1, wherein each of $R_1$, $R_2$, $R_3$ and $R_4$ is independently selected from the group consisting of hydrogen and methyl.

4. A method according to claim 1, wherein each of $R_1$, $R_2$, $R_3$ and $R_4$ is hydrogen.

5. A method according to claim 1, wherein in the carbide source reagent, M is Si comprises a compound of the formula:

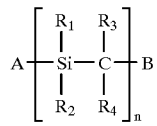

wherein:
$R_1$, $R_2$, $R_3$ and $R_4$ may each vary independently of the others and are selected from the group consisting of hydrogen and $C_1$–$C_8$ alkyl;
A and B may vary independently of one another and are selected from the group consisting of $C_1$–$C_4$ alkyl; and
n is at least 2.

6. A method according to claim 5, wherein each of $R_1$, $R_2$, $R_3$ and $R_4$ is independently selected from the group consisting of hydrogen and $C_1$–$C_4$ alkyl.

7. A method according to claim 5, wherein each of $R_1$, $R_2$, $R_3$ and $R_4$ is independently selected from the group consisting of hydrogen and methyl.

8. A method according to claim 5, wherein each of $R_1$, $R_2$, $R_3$ and $R_4$ is hydrogen.

9. A method according to claim 1, wherein the steps of vaporizing the carbide source reagent to form the carbide source reagent vapor, and contacting the carbide source reagent vapor with the substrate to deposit the carbide material on the substrate, comprises liquid delivery chemical vapor deposition.

10. A method according to claim 1, wherein the step of vaporizing the carbide source reagent to form the carbide source reagent vapor, comprises injection of the carbide source reagent into a chemical vapor deposition chamber, or vaporizing the carbide source reagent in a separate vaporizer chamber, and the step of contacting the carbide source reagent vapor with the substrate to deposit the carbide material on the substrate is carried out in said chemical vapor deposition chamber.

11. A method according to claim 1, wherein the step of vaporizing the carbide source reagent to form the carbide source reagent vapor, comprises nebulization of the carbide source reagent.

12. A method according to claim 1, wherein the substrate comprises at least one fiber.

13. A method according to claim 1, wherein the substrate comprises a surface.

14. A method according to claim 1, wherein the substrate comprises a semiconductor device structure.

15. A method according to claim 1, wherein the substrate comprises a continuous or discontinuous phase of a fiber reinforced matrix composite.

16. A method according to claim 15, wherein the carbide material deposited on the substrate forms a continuous phase of the fiber reinforced matrix composite.

17. A method according to claim 15, wherein the carbide material deposited on the substrate forms an interlayer between a continuous phase and the discontinuous phase of the fiber reinforced matrix composite.

18. A method according to claim 1, wherein the carbide material deposited on the substrate comprises a tribological coating.

19. A method according to claim 1, wherein the carbide material deposited on the substrate comprises a protective, semiconductor, or optical coating for the substrate.

20. A method of liquid delivery chemical vapor deposition of silicon carbide on a substrate, comprising providing a silicon carbide source reagent, volatilizing the silicon carbide source reagent to form source reagent vapor, flowing the source reagent vapor to a chemical vapor deposition chamber, and depositing silicon carbide on the substrate in the chemical vapor deposition chamber, wherein the silicon carbide source reagent comprises

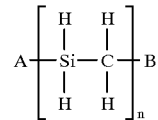

wherein:
A and B vary independently of one another and are selected from the group consisting of $C_1$–$C_4$ alkyl; and
n is at least 2.

21. A method of forming a coating of a carbide material on a substrate, comprising flash vaporizing a carbide source reagent and contacting the substrate with the vapor, wherein the carbide source reagent comprises a compound of the formula:

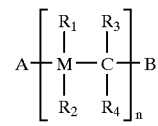

wherein:
$R_1$, $R_2$, $R_3$ and $R_4$ may each vary independently of the others and are selected from the group consisting of hydrogen and $C_1$–$C_8$ alkyl;
M is selected from the group consisting of Si, Nb, Ge, Sn, Pb, V, W, Cr, Mo, Ta, Ti, Zr, Hf, Mn, Pt, Pd, Ir, Rh and Ru;
A and B vary independently of one another and are selected from the group consisting of $C_1$–$C_4$ alkyl; and
n is at least 2.

22. A method according to claim 21, wherein each of $R_1$, $R_2$, $R_3$ and $R_4$ is independently selected from the group consisting of hydrogen and $C_1$–$C_4$ alkyl.

23. A method according to claim 21, wherein each of $R_1$, $R_2$, $R_3$ and $R_4$ is independently selected from the group consisting of hydrogen and methyl.

24. A method according to claim 21, wherein each of $R_1$, $R_2$, $R_3$ and $R_4$ is hydrogen.

25. A method according to claim 21, wherein in the carbide source reagent, M is Si comprises a compound of the formula:

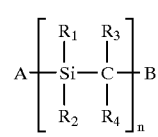

wherein:
$R_1$, $R_2$, $R_3$ and $R_4$ may each vary independently of the others and are selected from the group consisting of hydrogen and $C_1$–$C_8$ alkyl;

A and B may vary independently of one another and are selected from the group consisting of hydrogen and $C_1$–$C_4$ alkyl; and n is at least 2.

26. A method according to claim 25, wherein each of $R_1$, $R_2$, $R_3$ and $R_4$ is independently selected from the group consisting of hydrogen and $C_1$–$C_4$ alkyl.

27. A method according to claim 25, wherein each of $R_1$, $R_2$, $R_3$ and $R_4$ is independently selected from the group consisting of hydrogen and methyl.

28. A method according to claim 25, wherein each of $R_1$, $R_2$, $R_3$ and $R_4$ is hydrogen.

\* \* \* \* \*

UNITED STATES PATENT AND TRADEMARK OFFICE
CERTIFICATE OF CORRECTION

PATENT NO : 5,952,046
DATED : Sept. 14, 1999
INVENTOR(S) : Paul V. Chayka

It is certified that error appears in the above-identified patent and that said Letters Patent are hereby corrected as shown below:

Column 12, line 58:  change "NB" to --Nb--.
Column 13, line 6-22:  Claim 5 should read --5. A method according to claim 1, wherein in the carbide source reagent, M is Si.--.
Column 14, line 53-Column 15, line 4:  Claim 25 should read --25. A method according to claim 21, wherein in the carbide source reagent, M is Si.--.

Signed and Sealed this

Tenth Day of April, 2001

Attest:

NICHOLAS P. GODICI

Attesting Officer    Acting Director of the United States Patent and Trademark Office